(12) United States Patent
Gong et al.

(10) Patent No.: US 6,680,457 B2
(45) Date of Patent: Jan. 20, 2004

(54) REFLOWING OF SOLDER JOINTS

(75) Inventors: William Gong, Sunnyvale, CA (US); Richard Tella, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/047,567

(22) Filed: Jan. 15, 2002

(65) Prior Publication Data

US 2003/0132273 A1 Jul. 17, 2003

(51) Int. Cl.⁷ .......................... B23K 26/00; B23K 31/02
(52) U.S. Cl. ........................ 219/121.66; 219/121.85; 228/234.1; 228/245
(58) Field of Search ................... 228/234.1, 248.1, 228/248.5, 245; 219/121.85, 121.6, 121.64, 121.66

(56) References Cited

U.S. PATENT DOCUMENTS

| | | | | |
|---|---|---|---|---|
| 3,797,100 A | * | 3/1974 | Browne ...................... 228/102 |
| 4,531,044 A | * | 7/1985 | Chang ................... 219/121.85 |
| 4,700,044 A | * | 10/1987 | Hokanson et al. ...... 219/121.63 |
| 4,894,509 A | * | 1/1990 | Chalco et al. ........... 219/121.6 |
| 5,023,426 A | * | 6/1991 | Prokosch et al. ...... 219/121.63 |
| 5,042,709 A | * | 8/1991 | Cina et al. .................. 228/105 |
| 5,164,566 A | * | 11/1992 | Spletter et al. ........ 219/121.63 |
| 5,213,515 A | * | 5/1993 | Ishikawa et al. .............. 439/79 |
| 5,233,152 A | * | 8/1993 | Prokosch et al. ...... 219/121.63 |
| 5,272,307 A | * | 12/1993 | Jones ....................... 219/121.6 |
| 5,289,966 A | * | 3/1994 | Izumi et al. ............. 228/180.21 |
| 5,551,628 A | * | 9/1996 | Van Gerven et al. .... 228/248.1 |
| 5,604,831 A | * | 2/1997 | Dittman et al. ................ 385/88 |
| 5,742,025 A | * | 4/1998 | Dittman et al. ......... 219/121.64 |
| 5,763,854 A | * | 6/1998 | Dittman et al. ......... 219/121.63 |
| 5,920,462 A | * | 7/1999 | Glovatsky et al. .......... 361/760 |
| 6,072,148 A | * | 6/2000 | Azdasht ................. 219/121.63 |
| 6,168,070 B1 | * | 1/2001 | Sinkunas .................. 228/179.1 |
| 6,278,078 B1 | * | 8/2001 | Walvoord et al. ....... 219/121.61 |
| 6,284,998 B1 | * | 9/2001 | Sinkunas et al. ....... 219/121.64 |
| 6,423,154 B1 | * | 7/2002 | Van Gerven et al. ......... 148/24 |
| 6,501,043 B1 | * | 12/2002 | Ruben .................... 219/121.64 |

* cited by examiner

Primary Examiner—Tom Dunn
Assistant Examiner—Colleen P. Cooke

(57) ABSTRACT

A solder reflow system is disclosed that includes a substrate, a solder pad disposed upon the substrate, an optical component disposed upon the solder pad, and a laser positioned above the substrate with laser output focused sufficiently close to the solder pad to reflow the solder when the laser is powered. Also disclosed is a method for reflowing a solder joint, including: providing an optical component assembly including a substrate, a solder pad disposed upon the substrate, solder disposed upon the solder pad, and an optical component disposed upon the solder pad; providing a laser; positioning the laser above the substrate with laser output focused sufficiently close to the solder pad, instead of directly over the solder pad; and powering the laser, thereby transferring energy through the substrate into the solder pad, and reflowing the solder.

23 Claims, 3 Drawing Sheets

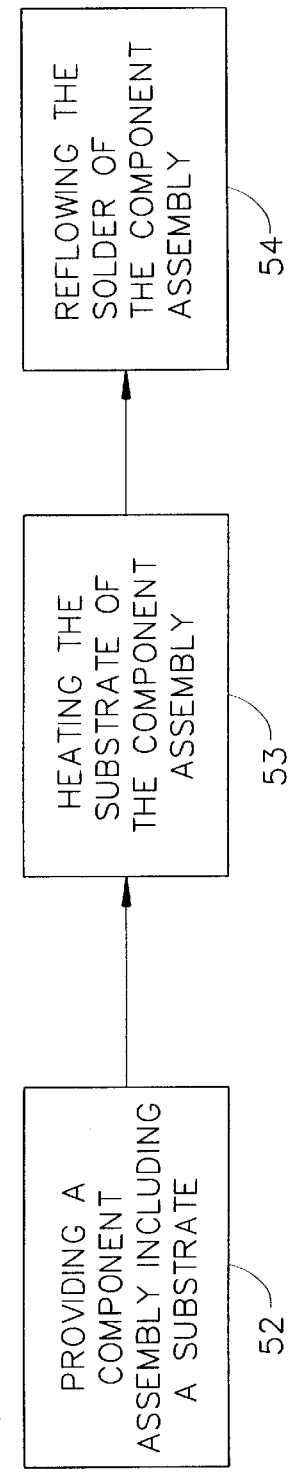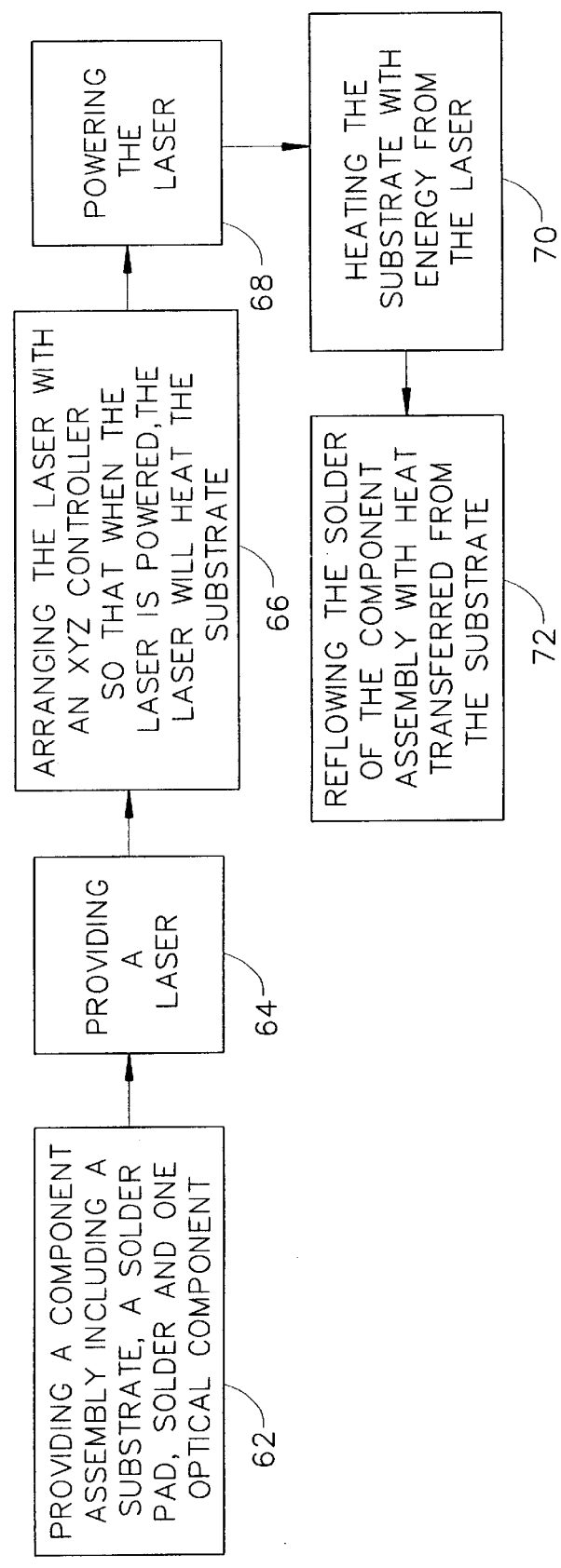

REFLOWING OF SOLDER JOINTS

TECHNICAL FIELD

The present invention is generally related to electronic components and, more particularly, is related to reflowing of solder joints of such electronic components.

BACKGROUND OF THE INVENTION

In many applications requiring high-precision alignment of fiber optic components, it is desired to attach the optical component onto a substrate using solder, while maintaining the alignment of the optical component with its desired target. If two or more components share the same substrate, it is sometimes not possible to globally heat the substrate to melt the solder while maintaining alignment of each component on the substrate. When the substrate is globally heated, other solder joints may reflow, causing misalignment of the optical components.

Often, each component is sequentially aligned while locally heating each solder joint. One method of local heating involves the use of a contacting heat source, for example a soldering iron tip, in order to reflow the solder. There are several disadvantages associated with this method of reflow. For example, the solder joint is typically very small and it is a challenge to create a solder tip in such a small size. It is also difficult to accurately place the tip of the iron. Further, if high-temperature solder is used, the solder tip can degrade very quickly, adding time and cost to the process because of the high cost and incidence of replacement of the solder tips. Additionally, manipulating the small solder tip onto the solder joint is a slow and tedious process. Further, because the solder iron tip must actually touch the solder, the solder iron tip can potentially disturb alignment of the optical component during the reflow process.

It is known in the art to use a laser instead of a solder tip to reflow solder. Use of a laser avoids some of the disadvantages of the solder tip reflow process, and the laser can be focused to provide heat only to the desired area. Using a laser for reflow, however, has its own disadvantages. For example, one problem is regulating the heat being absorbed into the solder joint in order to obtain the correct temperature desired for reflow. Previously the laser beam has been aimed directly on top of the solder pad, as depicted in FIG. 1. FIG. 1 is a block diagram of a plan view of a solder joint assembly 10 as known in the art. The solder joint assembly 10 includes a substrate 11 on which is disposed the optical component 12. The output beam 16 of a laser 17 is positioned above a solder pad 14 and solder (not shown) in order to heat the solder.

One problem with placing the laser output 16 directly over solder pad 14 is that the solder has a surface finish that varies over part of the solder joint. This variation in the surface finish creates variability in the amount of energy that is reflected off the surface instead of being absorbed by the solder. The amount of heat that is reflected may vary widely from solder joint to solder joint, depending on the surface condition of the solder. For example, a solder joint may have flux remaining on it due to inefficient cleaning, which may affect the reflectivity of the solder. Additionally, absorption of energy by the solder is a function of temperature as well. The solder generally absorbs differently when it is hot than when it is at room temperature. Thus, the solder will heat unevenly unless its temperature is known when it is exposed to laser output 16. To correct this deficiency, an infrared (IR) detector may be used that provides temperature feedback; however this adds complexity to solder joint assembly 10. It is a challenge to measure temperature directly on the solder. Typically a very small spot size pyrometer is used to accomplish this, which adds further complexity and expense. Further, in certain situations there may not be enough room for the location of a temperature sensor.

Thus, a heretofore unaddressed need exists in the industry to address the aforementioned deficiencies and inadequacies.

SUMMARY OF THE INVENTION

The present invention involves predictably heating a substrate rather than a metallic solder pad. The system and method for reflowing solder joints includes the use of a laser. A high-power laser beam can be focused to apply heat only to a specific area that is desired, and thus avoid all of the problems associated with using a solder tip. Further, the system and method of the present invention includes focusing the laser output on the substrate adjacent the solder pad, rather than directly on the solder itself. Because the substrate has a more consistent finish than solder, it absorbs energy much more uniformly and consistently than solder. By positioning the laser output on the substrate and heating the substrate rather than the solder pad directly, a more uniform and consistent reflow of the solder is accomplished. Thus, the present system and method can prevent cross-reflow as well as eliminate the need for a bulky, expensive, and/or complex temperature feedback system.

In the invention, the laser beam output may be located approximately 100 microns ($\mu$m) from the edge of the solder pad. The laser beam spot size may be approximately 400 $\mu$m. The laser power may be approximately six watts (W). For other applications, these parameters may be different.

Briefly described, one aspect of the system, among others, can be implemented as follows. A solder reflow system includes a substrate, a solder pad disposed upon the substrate, an optical component disposed upon the solder pad, and a laser positioned above the substrate with the laser output focused sufficiently close to the solder pad to reflow the solder when the laser is powered. The solder reflow system may include the laser output being positioned from approximately 100 to approximately 200 microns away from the solder pad. The substrate is heated by the laser output and transfers the heat to the solder.

The present invention can also be viewed as providing methods for reflowing solder. In this respect, the invention can include first providing an optical component assembly system. The optical component assembly may include a substrate, a solder pad disposed upon the substrate, solder disposed upon the solder pad, and the optical component also disposed upon the solder pad. The assembly system may also include a laser. The invention further includes positioning the laser output onto the substrate with its output focused sufficiently close to the solder pad but not directly over the solder pad. The laser is then powered so that energy is transferred through the substrate into the solder pad, reflowing the solder.

Clearly, not all of the above advantages listed herein will be present in every realization of the invention. Additionally, other systems, methods, features, and advantages of the present invention will be or become apparent to one with skill in the art upon examination of the following drawings and detailed description. It is intended that all such additional systems, methods, features, and advantages be included within this description, be within the scope of the invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5 is a flow chart of the method of reflowing solder joints.

FIG. 6 is a flow chart of one embodiment of the method of FIG. 4.

DETAILED DESCRIPTION

Figure 1:
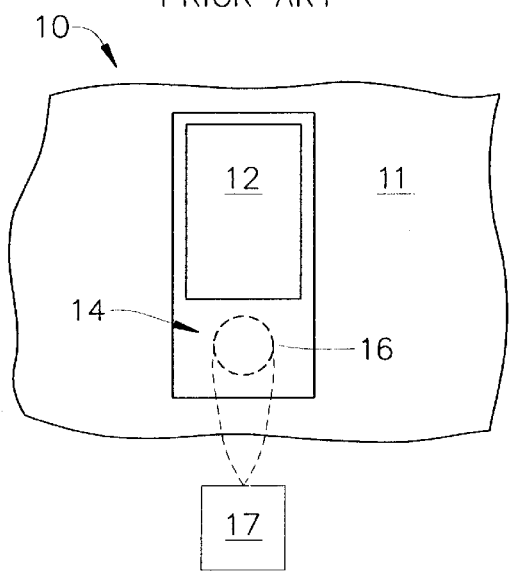
FIG. 1 is a plan view of an optical component assembly known in the art.
Figure 2:
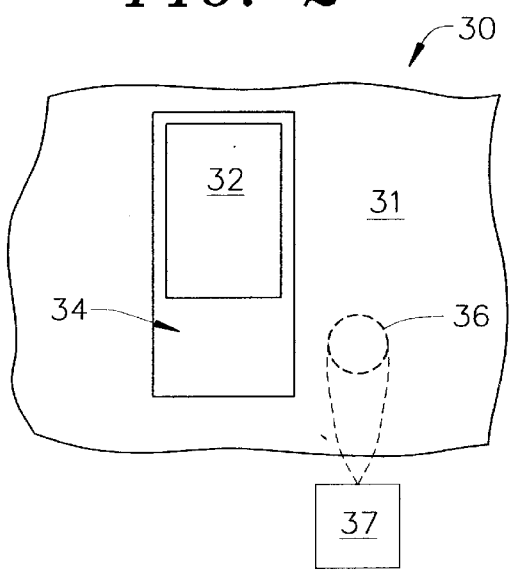
FIG. 2 is a plan view of the optical component assembly of the present invention.

Reference will now be made in detail to the description of the invention as illustrated in the drawings with like numerals indicating like parts throughout the several views. As mentioned hereinbefore, the present invention relates generally to a method of reflowing solder joints. FIG. 2 represents a solder joint assembly 30 which may be reflowed using the present system and method. The solder joint assembly 30 includes a substrate 31 on which is disposed an optical component 32. A solder pad 34 is disposed on the substrate 31 and solder 33 (FIGS. 3A and 3B) is disposed on the solder pad 34. Solder 33 may be any solder known in the art, and preferably is a gold-tin alloy. Laser output 36, however, is positioned on the substrate 31 instead of solder pad 34 and sufficiently close to solder pad 34 to effect reflow of the solder 33 when the laser 37 is powered. The substrate 31 is a material capable of absorbing energy at a wavelength emitted by laser 37, e.g., a material that is non-metallic. Substrate 31 may be for example, but not limited to, ceramic or silicon. For example, substrate 31 may be aluminum oxide ceramic. Because substrate 31 has a more consistent finish than solder 33, it absorbs energy much more uniformly and consistently than solder 33. Further, substrate 31 may be made of a material that has absorption that is not a function of temperature so that it heats fairly uniformly. If the laser output 36 of laser 37 is sufficiently close to solder pad 34, the substrate material 31 will transfer enough of the energy from laser output 36 into the solder joint to cause reflow. The result is a consistent reflow at a given spot size and a given power level of laser 37 without the need for a temperature feedback system.

Ideally, the size of the laser output 36 (commonly referred to as spot size) is not so small as to concentrate too much of the power as to burn substrate 31 upon application of heat from laser 37. In one embodiment, a balance is maintained between a spot size large enough to prevent burning or melting of the substrate 31 and small enough not to directly heat the target solder joint or neighboring solder joints. Spot size is controlled by defocusing the laser beam, so it is determined by the distance of the laser 37 from substrate 31. The spot size may range from approximately 200 $\mu$m to approximately 500 $\mu$m in diameter. The type of laser 37 that may be used to reflow the solder 33 is generally any high-powered laser capable of transferring sufficient heat to reflow the solder 33. Laser 37 may be for example, but not limited to, an approximately 15 watt (W)-fiber laser. For example, the laser 37 may be a 15 W laser operating at a 1.1 micron ($\mu$m) wavelength, such as that manufactured by and commercially available from SDL, Inc. of San Jose, Calif. For a 300 $\mu$m by 500 $\mu$m-sized gold-plated solder pad on which is deposited eutectic gold-tin solder, a laser power of 6 W should be sufficient to reflow the solder.

Depending at least on the geometry of solder pad 34 and the structure of substrate 31, an empirically-determined laser position can be maintained, and a laser power can be applied to provide a consistent solder reflow, without the use of a temperature feedback element. The laser output 36 may be located approximately 50 to approximately 100 $\mu$m from an edge of solder pad 34 In order to achieve reflow of the solder joint, it is useful to control three parameters of laser position, spot size of the laser beam, and laser power. For other applications, these parameters may be different.

Figure 3A:
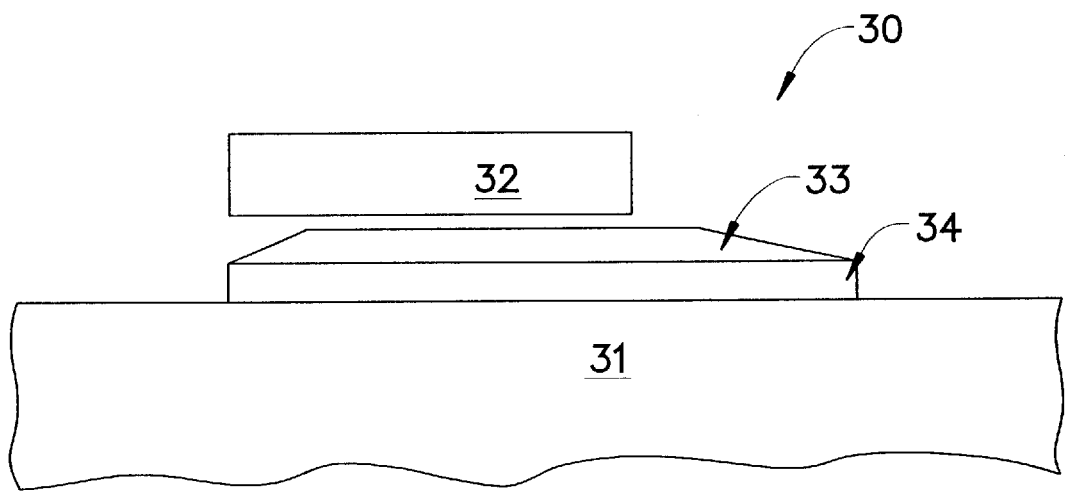
FIG. 3A is a side view of a cross section of the optical component assembly of FIG. 2 before reflow.
Figure 3B:
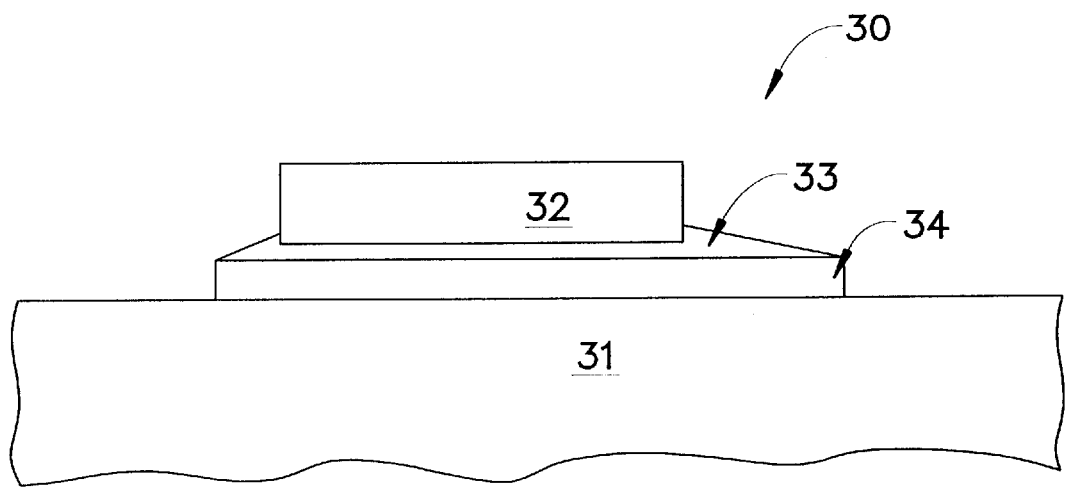
FIG. 3B is a side view of a cross section of the optical component assembly of FIG. 2 after reflow.

FIG. 3A depicts a side view of a cross section of the solder joint assembly 30 before reflow of the solder joint. The optical component 32 is positioned above the solder 33 which is disposed upon the solder pad 34. In turn the solder pad 34 is disposed upon the substrate 31. As can be seen in FIG. 3B, after reflow, the optical component 32 is embedded in solder 33, and disposed upon the solder pad 34.

Figure 4:
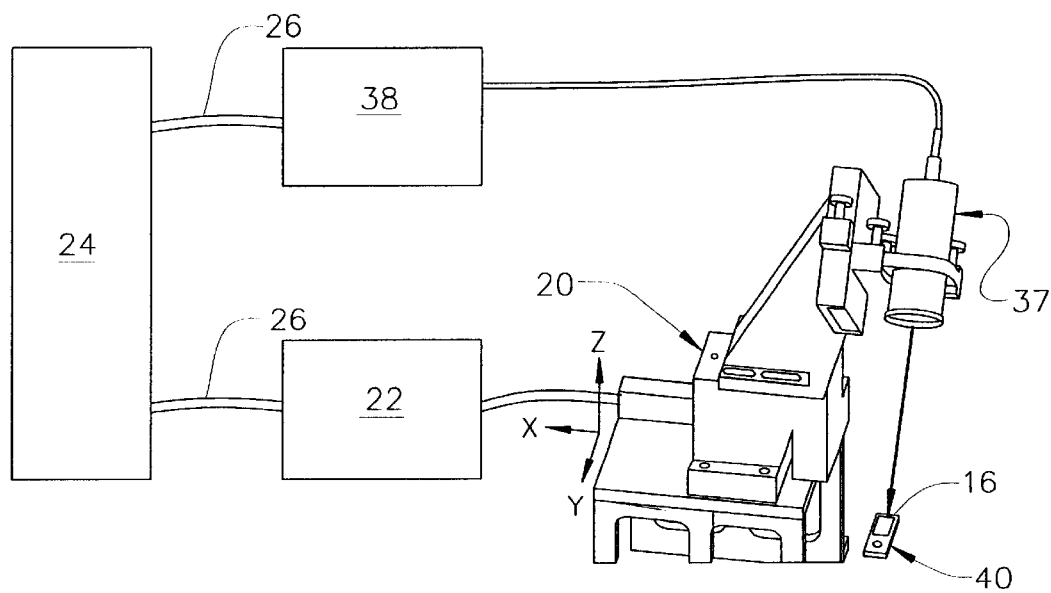
FIG. 4 is a combination of a block diagram and perspective drawing of the laser and laser control systems of the laser, and the optical component assembly of FIG. 2.

FIG. 4 depicts laser 37 and the apparatus and systems that controls its functioning. Laser output 36 can be moved in the XY and Z directions, so that it is positioned over the proper portion of substrate 31 in order to effect reflow of solder 33 (FIGS. 3A and 3B) of an optical component assembly 40. Laser 37 is attached to a known XYZ positioning system 20, which is connected to an XYZ controller 22. The XYZ controller 22 is connected to a computer 24 via a computer interface 26. In one embodiment, laser 37 may be positioned, for example but not limited to approximately 150 millimeters (mm) above a working surface of the solder joint assembly 30. Laser output 36 can be positioned by many other methods, including, but not limited to, a laser beam steering mirror.

The spot size of laser output 36 is controlled by the XYZ positioning system 20, which controls the distance of the laser 37 to the substrate 31. The power of laser output 36 is determined by laser controller 38, which is also connected to computer 24 via computer interface 26.

The present invention is also directed toward a method for reflowing solder joints as depicted in FIGS. 5 and 6. FIG. 5 is a flow chart of the general method 50 of the invention. In step 52, a component assembly is provided that includes the substrate 31. Moving to step 53, the substrate 31 of the component assembly is heated. In step 54, the solder 33 of the component assembly is reflowed, by transfer of the heat from the substrate 31 to the solder 33.

FIG. 6 depicts one exemplar embodiment method 60. In step 62, a component assembly is provided that includes substrate 31, solder pad 34, solder 33, and an optical component 32. The laser 37 is also provided, as shown in step 64. Laser 37 is positioned above substrate 31 and adjacent solder pad 34. As depicted in step 66, laser 37 may be controlled with an XYZ controller so that when the laser 37 is powered, laser output 36 will properly heat the substrate 31. Laser output 36 may be positioned using the apparatus and system of FIG. 4. It is desirable that laser output 36 be positioned sufficiently close to solder pad 34 so as to sufficiently heat the solder 33 in order to reflow the solder joint assembly 30. Moving to step 68, laser 37 is powered. As illustrated in step 70, the energy that is emitted from laser output 36 is absorbed by substrate 31. In step 72, the heat absorbed by the substrate 31 is transferred to the solder 33. The solder 33 is thereby uniformly heated and reflowed.

In one example of a solder joint assembly 30, solder pads 34 may be located approximately 500 microns ($\mu$m) apart from their centers. Assuming that the two solder pads 34 are each approximately 300 $\mu$m wide, there is an approximate 200-$\mu$m gap between solder pads 34. In this embodiment, laser output 36 is placed in the middle of the 200-$\mu$m gap, which is sufficiently close to transfer heat to the target solder pad 34. If laser output 36 is positioned on the opposite side of solder pad 34 from a previously aligned component 32 on an adjacent solder pad 34, then the laser output 36 will not affect the previously aligned component 32, thus reducing the problem of cross-reflow and misalignment of optical components 32 that are already aligned.

Another example of a solder joint assembly 30 may include a V-groove assembly as part of optical component 32. Because the V-groove has a larger solder pad 34, laser output 36 may be placed within approximately 100 $\mu$m to approximately 200 $\mu$m of the edge of solder pad 34 in order to couple enough heat into solder pad 34 to reflow all of the solder 33.

It should be emphasized that the above-described embodiments of the present invention are merely possible examples of implementations, and are merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention, and protected by the following claims.

What is claimed is:

1. A method of reflowing a solder joint, comprising:
   providing a component assembly including
      a substrate,
      a solder pad disposed upon the substrate,
      solder disposed upon the solder pad, and
      an optical component disposed upon the solder pad;
   providing a laser having an output;
   directly heating the substrate with the laser output, offset from the solder pad, so as to reflow the solder by heat conducted through the substrate into the solder pad.

2. The method of claim 1 wherein the substrate is non-metallic.

3. The method of claim 1 wherein the substrate is chosen from at least one of a ceramic and silicon.

4. The method of claim 1 wherein the substrate is heated local to the solder pad and solder that is being reflowed.

5. The method of claim 4 wherein the substrate is capable of absorbing heat at the wavelength of the laser.

6. The method of claim 4 wherein the laser emits light at a wavelength capable of heating the substrate.

7. The method of claim 4 further comprising positioning the laser output such that the laser output is not aligned with the solder pad.

8. The method of claim 7 further comprising positioning the laser output above the substrate with an XYZ positioning system.

9. The method of claim 1 further comprises positioning the laser output such that the laser output is laterally offset approximately 100 microns to approximately 200 microns from an edge of the solder pad.

10. The method of claim 7 wherein positioning the laser comprises controlling the spot size of the laser output.

11. The method of claim 10 wherein the spot size is approximately 400 microns in diameter.

12. The method of claim 4 further comprising controlling the laser power to effectively reflow the solder pad.

13. The method of claim 12 wherein the laser power is from approximately six watts to approximately fifteen watts.

14. A solder reflow system comprising:
   a substrate;
   a solder pad disposed upon the substrate;
   solder disposed upon the solder pad;
   an optical component disposed upon the solder pad; and
   a laser positioned above the substrate with a laser output of the laser laterally offset from the solder pad such that when the laser is powered the laser output directly strikes and heats the substrate to a temperature sufficient to reflow the solder.

15. The solder reflow system of claim 14 wherein the substrate is capable of absorbing heat at the wavelength of the laser.

16. The solder reflow system of claim 14 wherein the substrate comprises a material that is non-metallic.

17. The solder reflow system of claim 14 wherein the substrate comprises a material chosen from ceramic and silicon.

18. The solder reflow system of claim 14 wherein the laser emits light of a wavelength capable of heating the substrate.

19. The solder reflow system of claim 14 further comprising an XYZ controller, and wherein the laser output is positioned with the XYZ controller.

20. The solder reflow system of claim 19 wherein the XYZ controller controls a spot size of the laser output.

21. The solder reflow system of claim 14 further comprising a laser controller, wherein the laser controller controls the laser power used to reflow the solder pad.

22. An apparatus for reflowing a solder joint, comprising:
   a component assembly including
      a substrate,
      a solder pad disposed upon the substrate,
      solder disposed upon the solder pad,
      an optical component disposed upon the solder pad, and
      means for heating the substrate local to the solder and the solder pad;
   means for positioning the heating means above the substrate and sufficiently close to the solder pad to effect reflow, wherein the heating means directly strikes and heats the substrate; and
   means for powering the heating means, thereby transferring energy through the substrate into the solder pad, and locally reflowing the solder.

23. The apparatus for reflowing a solder joint of claim 22 wherein the means for heating the substrate comprises a laser.

* * * * *